United States Patent [19]

Kondo

[11] Patent Number: 5,677,839
[45] Date of Patent: Oct. 14, 1997

[54] ON-VEHICLE ELECTRONIC CONTROL DEVICE AND A METHOD OF DETECTING A FAILURE THEREOF

[75] Inventor: Shigeki Kondo, Himeji, Japan

[73] Assignee: Mitsubishi Denki Kabushiki Kaisha, Tokyo, Japan

[21] Appl. No.: 429,548

[22] Filed: Apr. 27, 1995

[30] Foreign Application Priority Data

Dec. 2, 1994 [JP] Japan .................. 6-299735

[51] Int. Cl.$^6$ .............. G01M 17/00; F02D 41/22; G01R 31/02
[52] U.S. Cl. .............. 364/424.034; 364/424.039; 364/424.053; 364/483; 361/18; 361/92; 340/663
[58] Field of Search .............. 364/424.03, 424.05, 364/481, 483, 477, 424.034, 424.036, 424.039, 424.053; 340/644, 660, 663; 361/3, 6, 18, 23, 33, 88, 92, 160; 324/418, 415, 422, 423; 307/10.1; 318/434, 293; 180/404, 443, 446

[56] References Cited

U.S. PATENT DOCUMENTS

| | | | |
|---|---|---|---|
| 4,516,076 | 5/1985 | Pillari et al. | 324/418 |
| 4,769,737 | 9/1988 | Ogita et al. | 361/203 |
| 4,940,102 | 7/1990 | Morishita | 180/446 |
| 4,972,133 | 11/1990 | Hirota et al. | 318/646 |
| 5,039,926 | 8/1991 | Morishita et al. | 180/446 |
| 5,065,101 | 11/1991 | Ledbetter | 324/415 |
| 5,134,375 | 7/1992 | Fuchi | 340/644 |
| 5,418,402 | 5/1995 | Fujiwara | 307/10.1 |
| 5,552,684 | 9/1996 | Wada et al. | 180/404 |

FOREIGN PATENT DOCUMENTS

| 55-2801 | 1/1980 | Japan . |
|---|---|---|
| 543191 | 10/1993 | Japan . |

Primary Examiner—Kevin J. Teska
Assistant Examiner—Tan Nguyen
Attorney, Agent, or Firm—Sughrue, Mion, Zinn, Macpeak & Seas, PLLC

[57] ABSTRACT

An on-vehicle electronic controller which controls the operation of a device of an automobile or an internal combustion engine is disclosed. A relay intermittently supplies power to a controlled apparatus. The controller first causes the apparatus to be operated for a predetermined period of time while the relay is off, thus ensuring that any residual voltage at the relay terminal is discharged. After the predetermined time, the relay terminal voltage is compared to a predetermined voltage. If the voltage is greater than the predetermined voltage, it is determined that the relay is welded shut.

8 Claims, 6 Drawing Sheets

FIGURE 1

FIGURE 2A POWER SOURCE VOLTAGE Va

FIGURE 2B RELAY OUTPUT VOLTAGE Vb

FIGURE 2C SOLENOID

ON-VEHICLE ELECTRONIC CONTROL DEVICE AND A METHOD OF DETECTING A FAILURE THEREOF

BACKGROUND OF THE INVENTION

1. Field of the Invention

The invention relates to an on-vehicle electronic control device having a relay intermitting a power supply to a control load which controls running of an automobile or an internal combustion engine, particularly to detecting of a failure of terminals of the relay.

2. Discussion of Background

Generally, an on-vehicle electronic control device controls many current driving or voltage driving control loads starting with a solenoid.

Among these control loads, especially, a control load having a considerable influence on a vehicle when the load is in failure, is often connected to a power source or to the ground through a relay. This is performed as a measure against a failure of the control load, wherein a fail-safe structure is constructed in which the system is fixed to the side of safety by disconnecting the supply of electricity to the control load, by detecting an abnormality of the control load and by opening the relay when the abnormality is determined to be dangerous to the system.

Figure 4:
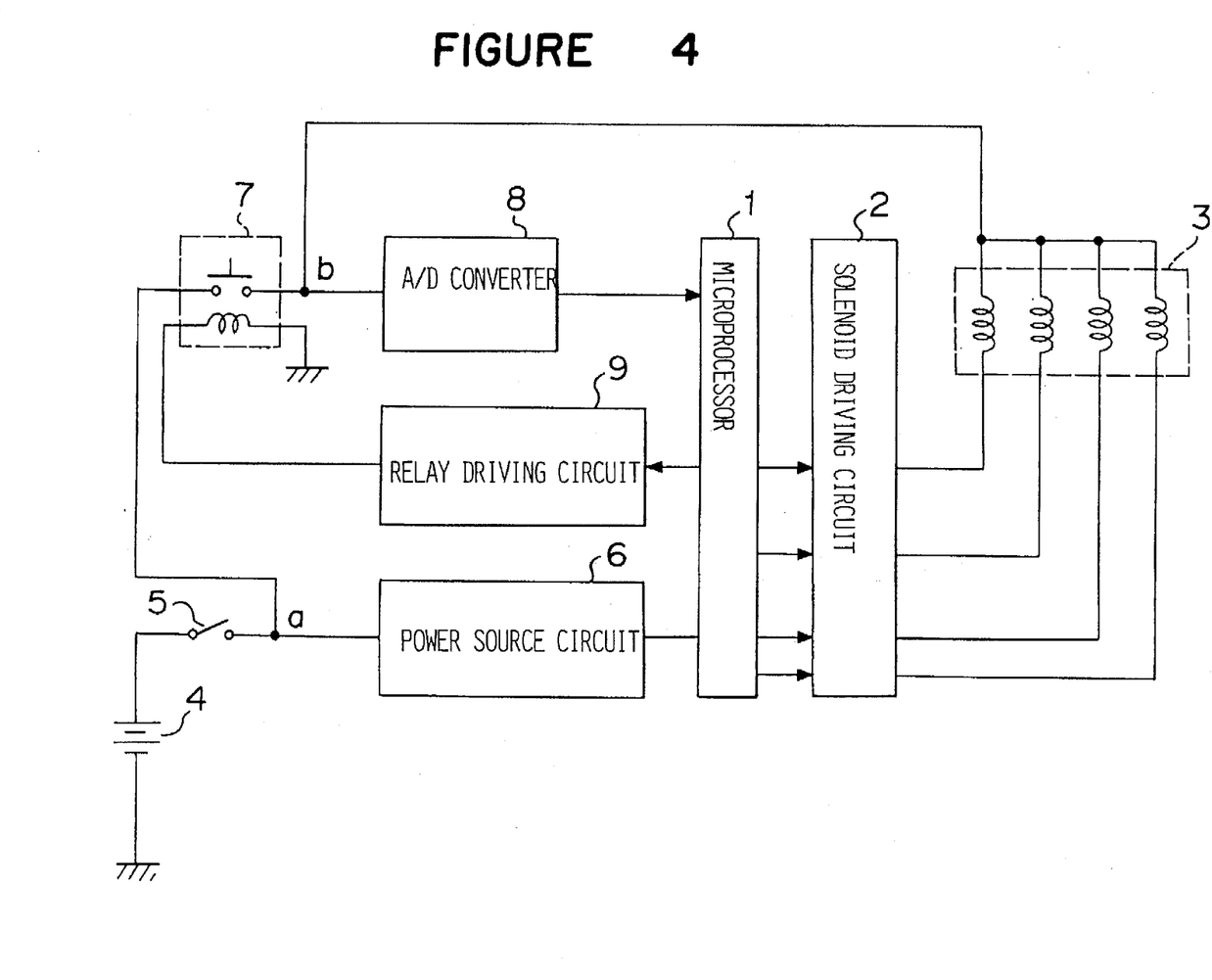
FIG. 4 is a block diagram showing a construction of a general on-vehicle electronic control device.

FIG. 4 shows the construction of a general on-vehicle electronic control device. In FIG. 4, numeral 1 designates a microprocessor as a control means for controlling the running of an automobile or an internal combustion engine, numeral 2 designates a solenoid driving circuit for driving a solenoid 3 that is a control load after receiving a drive order from the microprocessor 1, numeral 4 designates a power source for supplying power to the solenoid 3 and the microprocessor 1, numeral 5 designates a power source switch for closing or breaking the power source 4, numeral 6 designates a power source circuit for forming the power source of the microprocessor 1 based on the power from the power source 4, numeral 7 designates a relay having regularly open terminals as a relay arranged in a power supply path from the power source 4 to the solenoid 3, and numeral 8 designates an A/D converter which is connected to one end of terminals of the relay 7 and which is a voltage detecting means performing an A/D conversion by detecting a voltage outputted to the terminals of the relay 7, in which digital signals converted thereby are given to the microprocessor 1. Numeral 9 designates a relay driving circuit for controlling the relay 7 after receiving a signal from the microprocessor 1.

In the on-vehicle electronic control device constructed as above, the microprocessor 1 performs calculations based on various information, not shown, and controls to drive the solenoid 3 based on the calculations.

Further, when the A/D converter 8 detects a failure of the solenoid 3, for instance, a grounding short circuit or the like, the microprocessor 1 issues an order of opening the relay to the relay driving circuit 9. The power supply from the power source 4 to the solenoid 3 is disconnected by opening of the relay 7 by which the system that the on-vehicle electronic control device is controlling, is protected.

In the meantime, when the terminals of the relay are welded in the on-vehicle electronic control device, the relay 7 can not be opened even if the current flowing to the coil of the relay 7 is broken, and as a result, the fail-safe function is not operated.

Therefore, in this kind of device, the output voltage of the relay 7 is monitored by the A/D convertor 8 when the relay 7 is switched from the opening state to the closing state in starting the system, by which it is confirmed that the terminals of the relay 7 are not welded.

Figure 5:
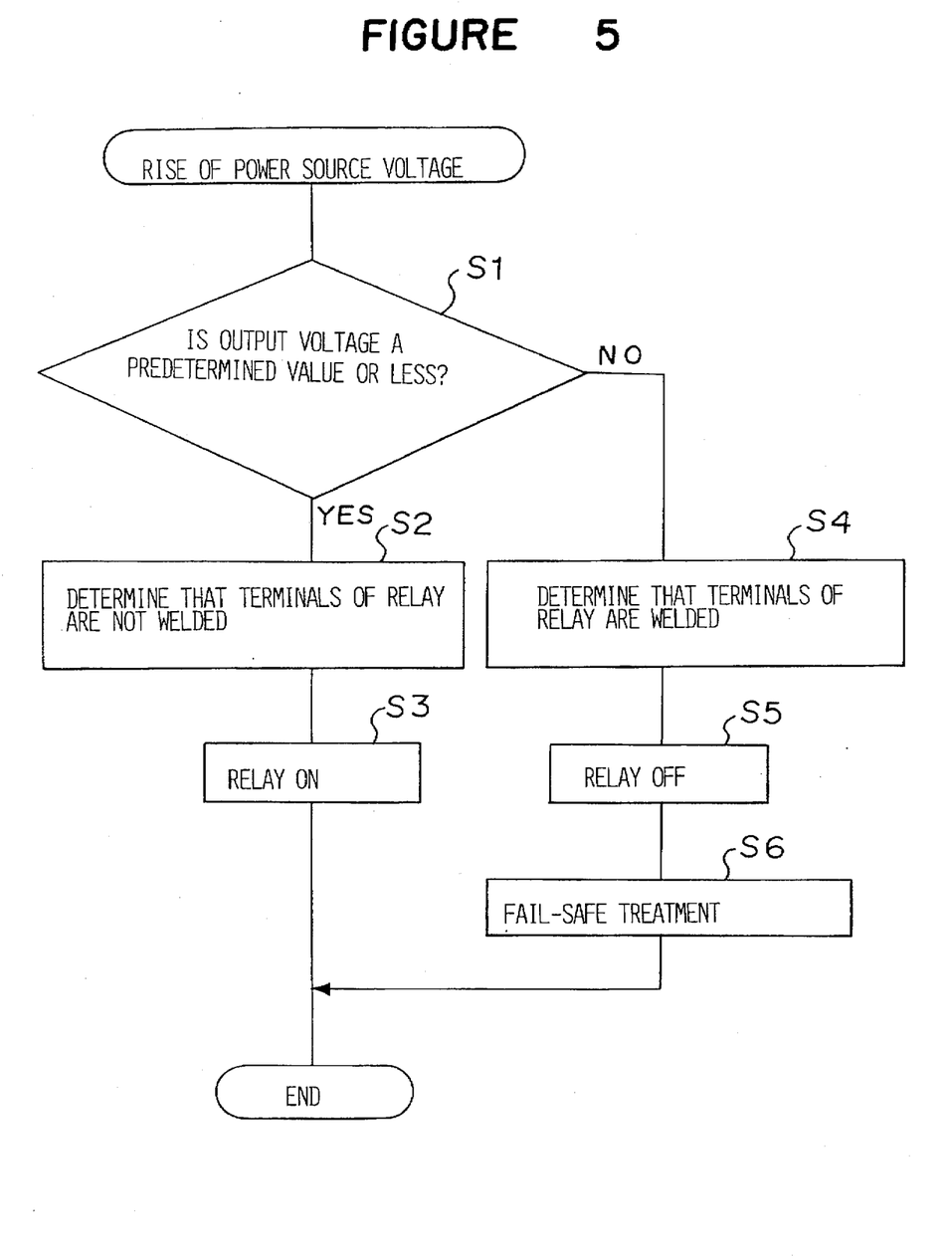
FIG. 5 is a flow chart showing a failure detecting procedure of a conventional on-vehicle electronic control device.

An explanation will be given of a method of confirming the state of the terminal of the relay 7 in reference to FIGS. 4 through 6. FIG. 5 is a flow chart for starting the system after confirming the state of the terminals, and FIGS. 6a–6c illustrates time charts thereof.

Figure 6A:
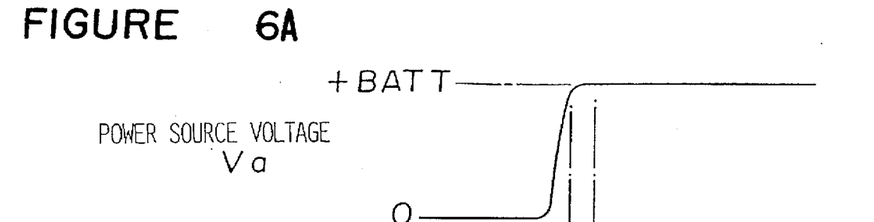
FIGS. 6a–6c illustrate time charts showing a behavior of a failure detection when a power source voltage of the conventional on-vehicle electronic control device rises.
Figure 6B:
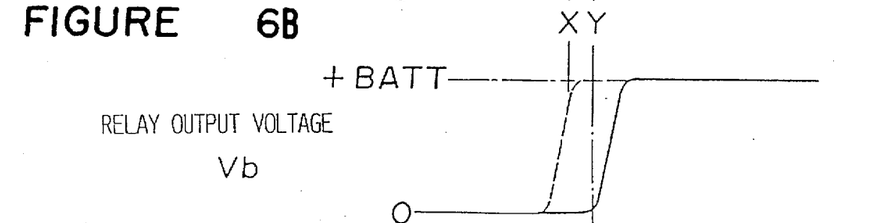
Figure 6C:
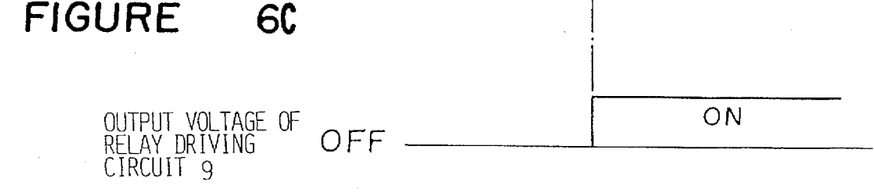

First, a power source voltage V that is outputted to a point "a" rises as shown in FIGS. 6a and 6b, when the power source switch 5 is closed. At this instance, the relay 7 is being opened since the output of the relay driving circuit 9 is a L-level signal. Therefore, the output voltage Vb at a point "b" is approximately 0 V. In step S1, the operation determines whether an output voltage Vb of the relay 7 is a predetermined value or less, at a time point "X" of FIG. 6a and 6b. When the output voltage Vb of the relay 7 is the predetermined value or less, the operation determines that the terminals of the relay 7 are not welded, in step S2, and proceeds to step S3. In step S3, the operation renders the output of the relay driving circuit 9 as a H-level signal at a time point "Y" of FIGS. 6a and 6b, by which the relay 7 is closed and the controlling of the control load 3 is started.

Further, when the operation determines as No in step S1, that is a case shown by a broken line in FIG. 6b, it is shown that a voltage is outputted to the point "b" although the relay 7 is not closed. In this case, the operation proceeds to step S4 and determines that the terminals of the relay 7 are welded. Further, the operation outputs a signal of opening the relay 7 in step S5, and thereafter, the operation performs the fail-safe treatment in step S6.

As stated above, in the conventional device, no problem occurs in a case wherein the power source voltage is risen from 0 volt by closing the power source switch 5. However, generally, the on-vehicle electronic control device is required to normally operate even under a Situation called an instantaneous disconnection of power source in which the connection of the device with the power source 4 is provided with a contact failure in a short period of time. Further, a consideration must be given to an operation in which the power source switch 5 is instantaneously broken and thereafter, it is closed again.

Figure 7A:
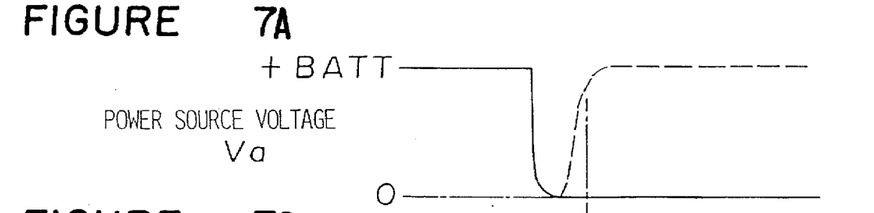
FIGS. 7a–7b illustrate time charts showing a behavior of a failure detection when a power source of the conventional on-vehicle electronic control device is instantaneously disconnected.
Figure 7B:
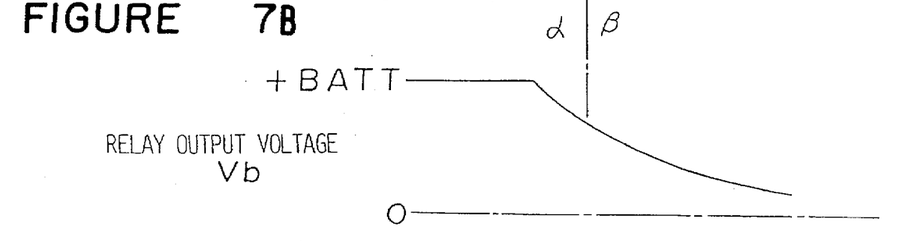

FIG. 7a and 7b illustrates the power source voltage Va that is outputted to the point "a" and the output voltage Vb of the relay 7 that is outputted to the point "b" when the power source switch 5 is broken. When the power source switch 5 is broken, the power source voltage Va swiftly falls as shown by the bold line. The voltage Vb that is outputted from the relay 7, falls more slowly than the power source voltage Va if the solenoid 3 connected to the relay 7 is broken, since the impedance becomes very high.

In the meantime, in case of the instantaneous disconnection of power source or when the power source switch 5 is instantaneously broken and thereafter, it is closed, the power source voltage Va rises again from a point "α" as shown by a broken line that is illustrated in FIG. 7a. At this instance, the confirmation of the state of the terminals of the relay is performed at a time point "β", and therefore, an erroneous determination will be performed such that the terminals are welded, since the output voltage of the relay 7 is not sufficiently lowered.

SUMMARY OF THE INVENTION

It is an object of the present invention to resolve the above problems and to provide an on-vehicle electronic control device which does not perform an erroneous detection such that a device is in failure even in a case in which a power source voltage instantaneously falls and immediately recovers.

Further, it is another object of the present invention to eliminate an influence on an on-vehicle electronic control device that is caused by closing control loads.

Further, it is another object of the present invention to swiftly perform a failure diagnosis of an on-vehicle electronic control device.

Further, it is another object of the present invention to stop controlling safely in detecting a failure of an on-vehicle electronic control device.

Further, it is still another object of the present invention to prevent terminals of a relay of an on-vehicle electronic control device from welding.

Further, it is still another object of the present invention to firmly perform a failure diagnosis of an on-vehicle electronic control device by a simple construction.

Further, it is still another object of the present invention to provide a method of detecting a failure of an on-vehicle electronic control device which does not perform an erroneous detection such that device is in failure even when a power source instantaneously falls and immediately recovers.

Further, it is still another object of the present invention to provide a method of detecting a failure of an on-vehicle electronic control device which firmly performs a failure diagnosis of the on-vehicle electronic control device in a simple procedure.

According to a first aspect of the present invention, there is provided an on-vehicle electronic control device comprising:

a control load for controlling a running of an automobile or an internal combustion engine;

a relay having terminals for intermitting a power supply from a power source to the control load;

a voltage detecting means for detecting a voltage outputted to the terminals of the relay;

a controlling means for controlling the control load and the relay;

said controlling means comprising:

a control load closing means for closing the control load when a signal for closing the terminals of the relay is not outputted; and an abnormality detecting means for detecting an abnormality of the terminals of the relay by comparing said voltage with a predetermined value after a predetermined time period elapses since the control load closing means has closed the control load.

According to a second aspect of the present invention, there is provided the on-vehicle electronic control device according to the first aspect, wherein the predetermined time period is a response time or less of a system having the control load closed by the control load closing means.

According to a third aspect of the present invention, there is provided the on-vehicle electronic control device according to the first aspect, wherein the control load closing means closes a plurality of control loads not interfering with each other.

According to a fourth aspect of the present invention, there is provided the on-vehicle electronic control device according to third aspect, wherein the controlling means stops controlling while the control loads closed by the control load closing means are being closed when the abnormality detecting means detects the abnormality of the terminals of the relay.

According to a fifth aspect of the present invention, there is provided the on-vehicle electronic control device according to the first aspect, wherein the controlling means starts controlling by closing the relay after breaking the control load when the abnormality detecting means does not detect the abnormality of the terminals of the relay.

According to a sixth aspect of the present invention, there is provided an on-vehicle electronic control device comprising:

a control load for controlling a running of an automobile or an internal combustion engine;

a relay having terminals for intermitting a power supply from a power source to the control load;

a voltage detecting means for detecting a voltage outputted to the terminals of the relay;

a power source detecting means for detecting that the power source has been broken;

a controlling means for controlling the control load and the relay;

said controlling means comprising:

a relay opening means for opening the terminals of the relay when the power source detecting means detects a breakage of the power source; and an abnormality detecting means for detecting an abnormality of the terminals of the relay by comparing the voltage with a predetermined value after the relay opening means has opened the terminals of the relay.

According to a seventh aspect of the present invention, there is provided a method of detecting a failure of an on-vehicle electronic control device comprising:

a step of closing a control load when a signal for closing terminals of a relay intermitting a power supply from a power source to the control load is not outputted;

a step of determining that a predetermined time period has elapsed after closing the control load;

a step of detecting a voltage outputted to the terminals of the relay after the predetermined time period has elapsed; and a step of detecting a failure of the terminals of the relay by comparing said voltage with a predetermined value.

According to an eighth aspect of the present invention, there is provided a method of detecting a failure of an on-vehicle electronic control device comprising:

a step of detecting a voltage outputted to terminals of a relay intermitting a power supply from a power source to a control load;

a step of determining that the power source has been broken;

a step of opening the terminals of the relay when a breakage of the power source has been determined; and a step of determining an abnormality of the terminals of the relay by comparing said voltage with a predetermined value after the terminals of the relay have been opened.

According to the first aspect of the on-vehicle electronic control device of this invention, the control load is closed when the signal for closing the terminals of the relay is not outputted, and the abnormality of the terminals of the relay is detected by comparing the voltage outputted to the terminals of the relay with the predetermined value after the predetermined time period elapses since the control load closing means has closed the control load.

According to the second aspect of the on-vehicle electronic control device of this invention, the detection of a failure is completed before the system having the control load that is closed by the control load closing means, responds.

According to the third aspect of the on-vehicle electronic control device of this invention, the detection of a failure is completed in a short period of time by closing the plurality of control loads that do not interfere with each other.

According to the fourth aspect of the on-vehicle electronic control device of this invention, the control is stopped while the control loads that have been closed by the control load closing means, are being closed, when the abnormality detecting means detects the abnormality of the terminals of the relay.

According to the fifth aspect of the on-vehicle electronic control device of this invention, the control starts by closing the relay after the control load has been broken, when the abnormality detecting means does not detect the abnormality of the terminals of the relay.

According to the sixth aspect of the on-vehicle electronic device of this invention, the abnormality of the terminals of the relay is detected by comparing the voltage that is outputted to the terminals of the relay with the predetermined value after the relay opening means has opened the terminals of the relay.

According to the seventh aspect of the method of detecting a failure of an on-vehicle electronic control device of this invention, the control load is closed when a signal for closing the terminals of the relay intermitting the power supply from the power source to the control load, is not outputted and the voltage outputted to the terminals of the relay, is detected after the predetermined time period has elapsed since the control load was closed, by which the abnormality of the terminals of the relay is detected by comparing the voltage that is outputted to the terminals of the relay with the predetermined value.

According to the eighth aspect of the method of detecting a failure of an on-vehicle electronic control device of this invention, the voltage that is outputted to the terminals of the relay transmitting the power supply from the power source to the control load, is detected, the terminals of the relay are opened when the breakage of the power source is determined, and the abnormality of the terminals of the relay is detected by comparing the voltage outputted from the terminals of the relay with the predetermined value after the terminals of the relay have been opened.

DETAILED DESCRIPTION OF THE PREFERRED EMBODIMENTS

EXAMPLE 1

Figure 1:
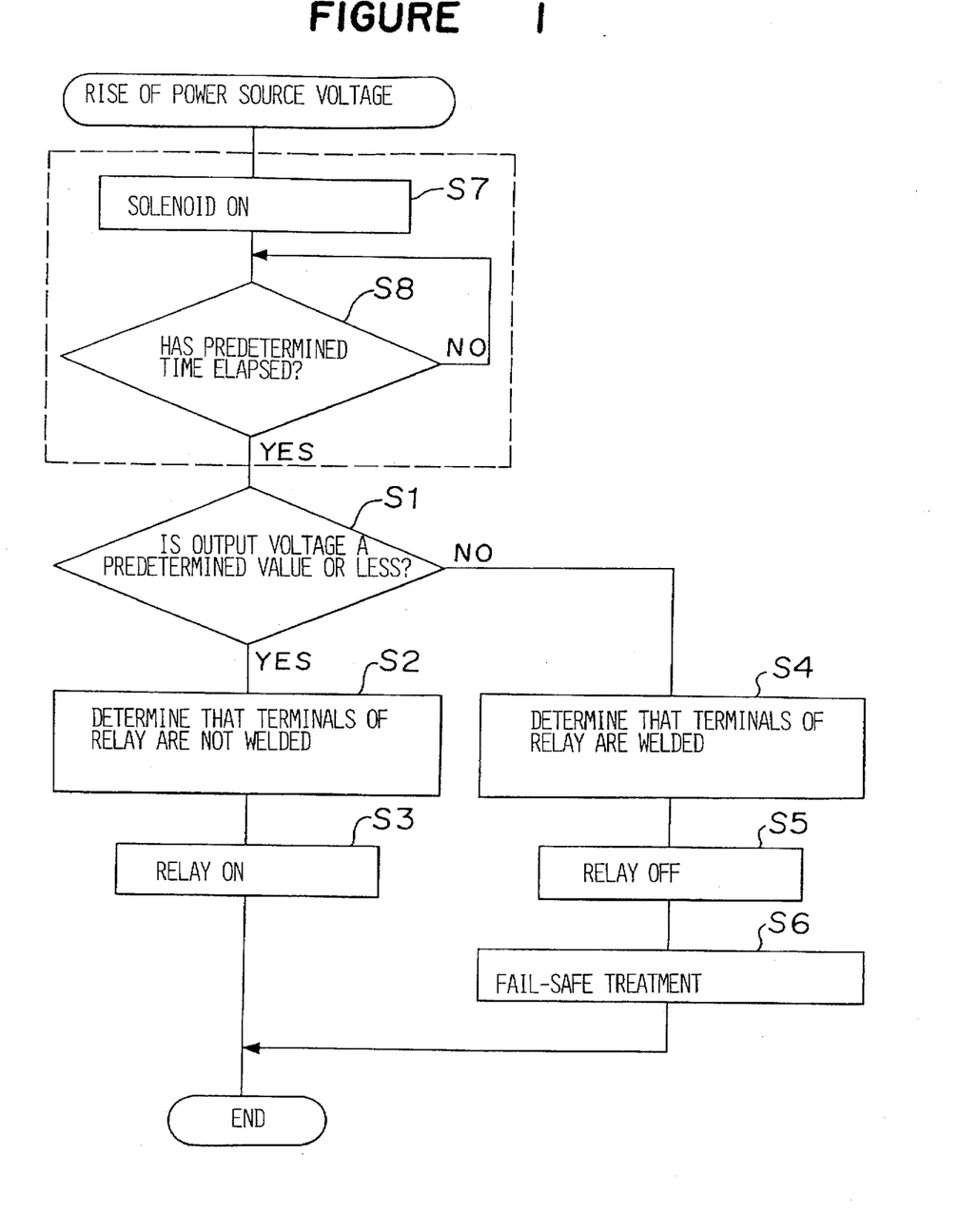
FIG. 1 is a flow chart showing a processing procedure of Examples 1 through 3 of this invention.
Figures 2A, 2B:
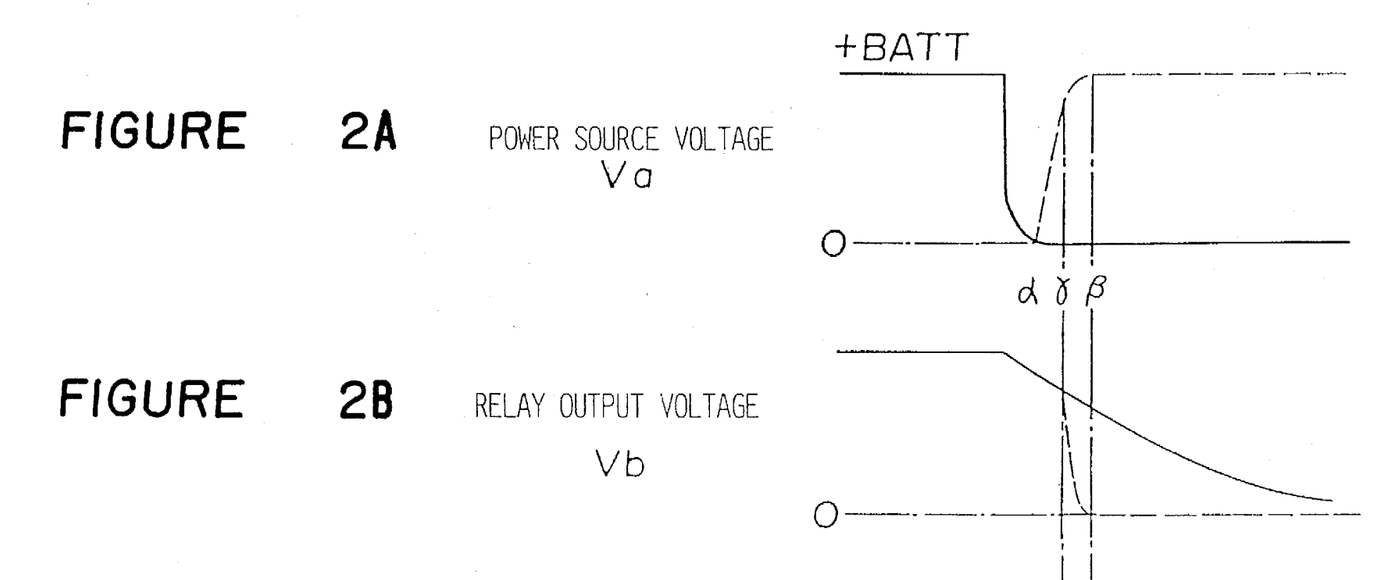
FIGS. 2a–2c illustrate time charts of FIG. 1.
Figure 2C:
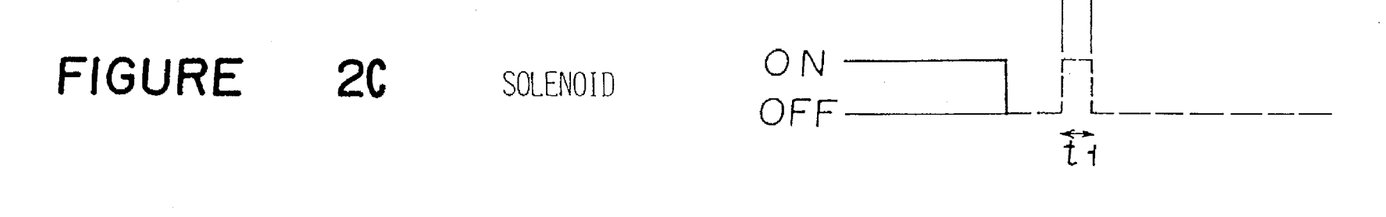

FIG. 1 is a flow chart showing a processing procedure of Examples 1 through 3, and FIGS. 2a–2c illustrate time charts of FIG. 1 In comparison with FIG. 5, a processing that is enclosed by a broken line is added to FIG. 1. Further, the construction of this invention is the same as that in FIG. 4, and therefore, an explanation will be given by using FIG. 4.

In Example 1, the solenoid 3 is closed in step S7 that indicates the operation of a control load closing means, after the power source voltage has risen. Thereby, electric charge accumulated on the power source supply path of the solenoid 3 is discharged via the solenoid 3. This processing continues during the predetermined time period of t1 in the succeeding step S8.

By this processing, even if a voltage for a residual charge remains at the output terminals of the relay 7, it is discharged. Thereafter, the processing the same as that in the conventional example is successively carried out.

Now, consider a case in which the power source voltage is made to rise by closing the power source switch 5.

When the terminals of the relay are not welded, the power source voltage Va and the output voltage Vb of the relay rise as the bold lines of FIGS. 6a and 6b, similar to the conventional example. At this instance, at the time point "X" for checking the state of welding, the output voltage Vb at the relay 7 is approximately 0 V, the operation determines Yes in the succeeding step S1 that indicates the operation of the abnormality detecting means, and determines that the terminals are not welded, in the succeeding step S2. The processing thereafter is the same as in the conventional example and the explanation will be omitted.

When the terminals of the relay 7 are welded, the output voltage Vb of the relay 7 rises as the broken line of FIG. 6b. At this instance the output voltage Vb of the relay 7 is sufficiently high at the point "X" for checking the welding of the terminals of the relay. Accordingly, the operation determines as No in the succeeding step S1, and determines that the terminals are welded, in the succeeding step S4. The processing thereafter is the same as that in the conventional example and the explanation will be omitted.

In this way, in the case wherein the power source voltage rises from 0 V, Example 1 operates as the conventional example.

Next, an explanation will be given of a case wherein the power source voltage Va instantaneously falls, and immediately recovers from the point "α" as shown by the broken line of FIG. 2a.

At this instance, when the terminals of the relay 7 are welded, the output voltage Vb of the relay 7 shares the same waveform as the power source voltage Va shown by the broken line of FIG. 2a. At this occasion, the confirmation of the state of the terminals of the relay 7 in step S1 is carried out at the timing of the time point "β". At this moment, the operation determines No since the output voltage Vb of the relay 7 is sufficiently high and determines that the terminals are welded, in step S4 and carries out the processing thereafter.

When the terminals of the relay 7 are not welded, normally, the output voltage Vb of the relay 7 gradually changes as shown by the bold line of FIG. 2b. By contrast, in Example 1, the accumulated charge is dissipated by closing the solenoid 3 at a time point "γ", in step S7, whereby the output voltage Vb of the relay 7 is made rapidly fall as shown by the broken line. The closing of the solenoid 3 continues for a predetermined time period t1 in step S8.

The processing of the step S1 is carried out at the time point "β" after the predetermined time period t1 has elapsed, and the output voltage Vb of the relay 7 is sufficiently small at this moment. Therefore, the operation determines as Yes, determines that the terminals are not welded, in step S2 and successively performs the processing thereafter.

Therefore, according to Example 1, the failure of the on-vehicle electronic control device can accurately be detected even in a situation in which the power source voltage instantaneously falls and immediately recovers.

EXAMPLE 2

The solenoid 3 that is the control load, is closed in the above Example 1. However, it is preferable to consider such that a system that the on-vehicle electronic control device controls, is not influenced by the closing operation.

That is, in the case in which the terminals of the relay 7 are welded, the solenoid 3 is driven for the predetermined time period t1 by the processings in steps S7 and S8. Therefore, with respect to the solenoid 3 that is closed by the processing of the steps of S7 and S8, it is preferable to select the solenoid 3 which is used in a system with no concern over the influence on the system even if the solenoid 3 is driven, among systems controlled by the on-vehicle electronic control device.

In Example 2, a solenoid related to a system of an automatic transmission, is closed in step S7, among a plurality of solenoids 3. In a system using a hydraulic circuit as an automatic transmission, the delay of the hydraulic circuit is normally 50 ms or more.

Accordingly, even if the solenoid 3 that is the control load is driven for the predetermined time period t1 (several ms) before starting the system, the system does not respond thereto and there is no concern over an adverse influence.

Therefore, according to Example 2, by setting the predetermined time period t1 as the response time or less of a system having a solenoid that is closed in step S7, the possibility of the adverse influence on the system due to the failure detection processing can be dispensed with.

EXAMPLE 3

In the above Examples, the solenoid is closed before closing the relay 7 to dissipate electric charge that has been accumulated in the power source supply path. In this case, the larger the number of closed solenoids 3 to be closed, the shorter the discharge time, and the failure detection processing can be completed in a shorter period of time. However, if the terminals of the relay 7 are welded, all the closed solenoids 3 are driven for the predetermined time period t1. Therefore, the plurality of solenoids 3 for closing should not be closed at random. It is necessary to previously select a safe combination in which they do not interfere with each other.

For instance, in the system of the automatic transmission, assume a case in which a combination is selected wherein a solenoid of a clutch and a solenoid of a brake in the same gear are closed. In this case, a force for increasing the rotation number due to the clutch and a force for decreasing the rotation number due to the brake may simultaneously operate, which amounts to destruction of the system of the automatic transmission in the worst case.

To prevent beforehand such an accident, in Example 3, a plurality of the solenoids 3 in a safe combination in which they do not interfere with each other, are closed.

Specifically, when the selected plurality of solenoids 3 are driven, the gear of the automatic transmission is disposed at the third gear position or at the neutral position. In this case, the third gear or the neutral position is often utilized as a comparatively safe gear in a general fail-safe mechanism.

Accordingly, the discharge time is shortened by closing the plurality of solenoids 3, and the gear is switched to the third gear or the neutral that is comparatively safe, when the terminals of the relay 7 are welded.

Further, when the terminals of the relay 7 are determined to be welded, it is not possible to perform a fail-safe operation by opening the relay 7, in case wherein a failure such as grounding or the like is caused in any one of the solenoids 3.

Accordingly, when the terminals of the relay 7 are determined to be welded, the closed solenoids 3 are maintained as they are, the control thereafter is stopped while the gear is being set to the comparatively safe third gear or neutral gear, thereby securing the safety of the system.

Therefore, according to Example 3, the failure detection processing can swiftly be completed by shortening the discharge time by closing the plurality of solenoids.

Further, there is no concern over an adverse influence on the system even if the terminals of the relay 7 are welded, since a safe combination is adopted to the plurality of solenoids 3 in which they do not interfere with each other.

Further, the fail-safe operation can simultaneously be carried out when the terminals of the relay 7 are welded, since the combination of the plurality of solenoids 3 is that which is generally used in the fail-safe mechanism.

Further, when the terminals of the relay 7 are welded, the comparatively safe state can be maintained and the safety of the system can be secured by stopping the control as they are.

EXAMPLE 4

In the flow chart of FIG. 1, the operation closes the relay 7 in step S3, immediately after step S2 wherein the operation has determined that the terminals of the relay are not welded.

However, the relay 7 is closed while the solenoid 3 is being closed. Therefore, there is a concern in which the terminals of the relay 7 are welded since a large current flows in closing the relay 7. Further, the time period which has elapsed until the relay 7 is actually closed after receiving the signal of H-level from the relay driving circuit 9 is longer than that of the solenoid 3. Therefore, it is difficult to perform the control at a time point proximate to that in closing the relay.

Accordingly, it is preferable to start the system by closing the relay 7 after breaking the solenoid 3 once and by closing again the solenoid 3 after awaiting a time period that is sufficient for ensuring the closing the relay 7.

Specifically, it is preferable to interpose a processing of breaking the solenoid 3 between step S2 and step S3, and to add a processing of awaiting a time period until the relay 7 is actually closed after a closing order has been issued, after step S3.

According to Example 4, there is no concern over the welding at the terminals of the relay 7 and the control at a time point proximate to that in closing the relay 7 can easily be performed.

EXAMPLE 5

In the above Examples, a failure is detected when the power source is closed or when the power source recovers. By contrast, in Example 5, the failure detection is performed before stopping a program and after detecting that the power source has been broken.

In this case, some solenoids 3 are closed in the operation of the system even if the solenoids 3 are not forcibly closed.

Accordingly, the failure detection can firmly be carried out by a construction that is simpler than those in the above Examples.

Figure 3:
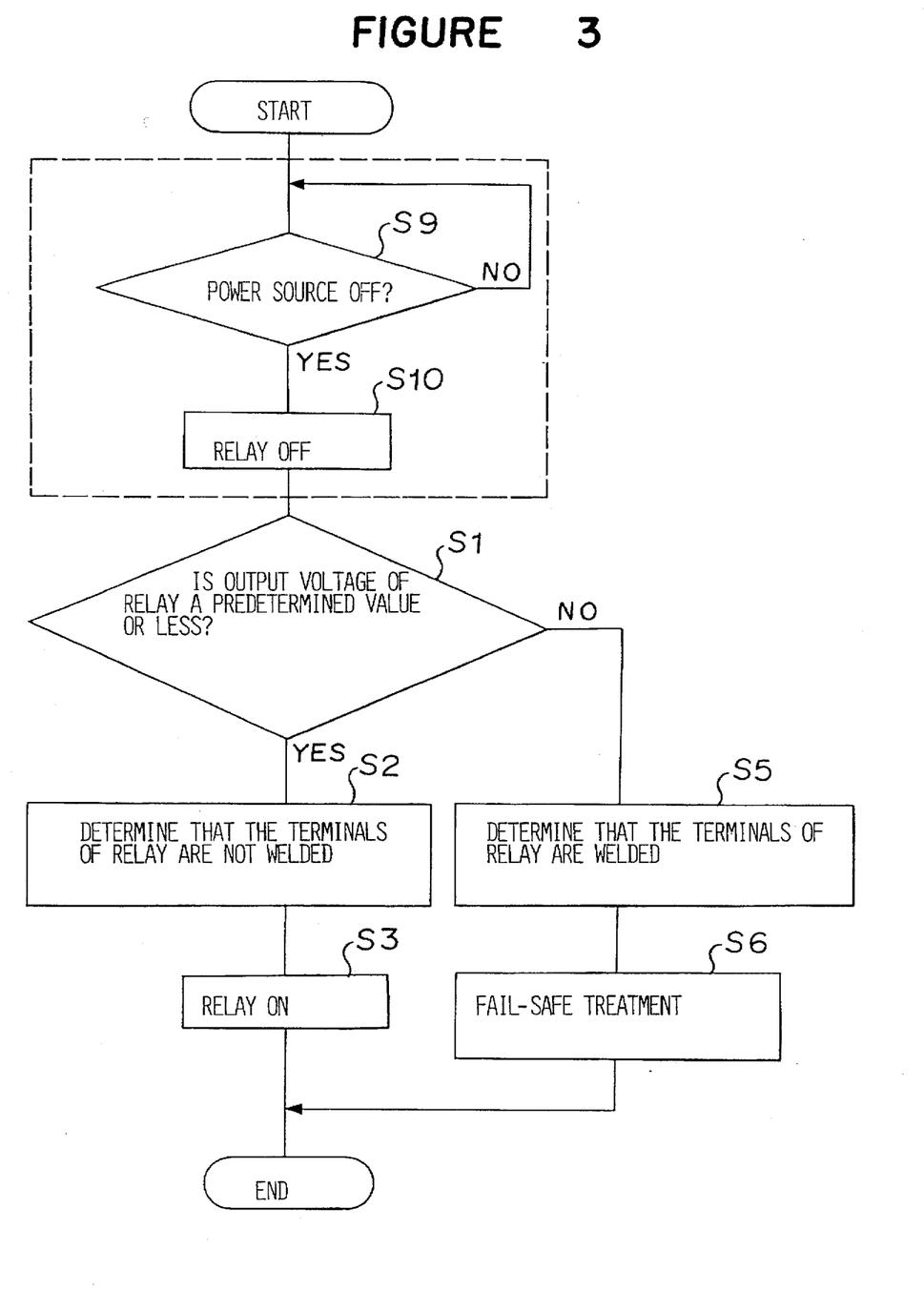
FIG. 3 is a flow chart showing a processing procedure of Example 5 of this invention.

FIG. 3 shows a flow chart of Example 5.

Step S9 signifies the operation of a power source detecting means, wherein the operation determines whether the power source is broken or not. This determination is performed based on the state of the power source switch 5, the power source voltage Va or the state of the output voltage of the power source circuit 6. The relay 7 is opened in the succeeding step S10 indicating the operation of the relay opening means. At this instance, the relay 7 is opened, and the solenoid 3 is closed, and therefore, the output voltage Vb of the relay 7 rapidly falls simultaneously with the detection of the breakage of the power source. Therefore, in step S1 which indicates the operation of the abnormality detecting means, the relay output voltage Vb is sufficiently smaller than the predetermined value. Accordingly, the operation firmly determines whether the device is under the normal condition even when the power source is instantaneously disconnected, and proceeds to the later processings.

Further, the relay 7 is opened in step S10, and therefore, step S5 is omitted.

Further, step S3 is not necessary when the control is finished by breaking the power source switch 5. However, it is added since the control should be started again when the power source is broken instantaneously. There occurs no special problem even if the control is stopped, while the relay 7 is being closed.

Therefore, according to Example 5, the output voltage Vb of the relay 7 rapidly falls simultaneously with the detection of the breakage of the power source, and therefore, the processings can be simplified with no need of awaiting for the predetermined period t1.

Further, it is possible to swiftly finish the processings of the failure detection since it is not necessary to await for the predetermined time period tl. As stated above, according to the present invention, the charge which has been accumulated is discharged by closing the control load in detecting a failure. Therefore, no erroneous detection is performed such that the device is in failure even in a case in which the power source falls instantaneously and recovers immediately.

Further, according to the present invention, the time period for closing the control load is not larger than the response time of the system, and accordingly, the adverse influence on the on-vehicle electronic control device due to the closing of the control load can be dispensed with.

Further, according to the present invention, the failure diagnosis of the on-vehicle electronic control device can swiftly be performed since the plurality of control loads are closed which do not interfere with each other.

Further, according to the present invention, in detecting the failure of the on-vehicle electronic control device, the control is stopped while the plurality of control loads are being closed that do not interfere with each other, and therefore, the control can be stopped safely.

Further, according to the present invention, when the failure is not detected, the relay is closed after the control load has been broken, and therefore, it is possible to prevent the terminal of the relay of the on-vehicle electronic control device from welding.

Further, according to the present invention, the relay is opened when the breakage of the power source is detected and the abnormality of the terminals of the relay is detected thereafter, and therefore, the failure diagnosis of the on-vehicle electronic control device can firmly be performed by a simple construction.

Further, according to the present invention, even when the power source falls instantaneously and recovers immediately thereafter, it is possible to provide the method of detecting a failure of the on-vehicle electronic control device which does not perform an erroneous detection such that the device is in failure.

Further, according to the present invention, it is possible to provide the method of detecting a failure of the on-vehicle electronic control device which firmly performs the failure diagnosis of the on-vehicle electronic control device by a simple procedure.

What is claimed is:

1. An on-vehicle electronic control device comprising:
   a control load for controlling a running of an automobile or an internal combustion engine;
   a relay having terminals for selectively supplying power from a power source to the control load;
   a voltage detecting means for detecting a voltage of the terminals of the relay;
   a controlling means for controlling the control load and the relay;
   said controlling means comprising:
   a control load closing means for closing the control load when a signal for closing the terminals of the relay is not outputted; and
   an abnormality detecting means for detecting an abnormality of the terminals of the relay by comparing said voltage with a predetermined value after a predetermined time period elapses since the control load closing means has closed the control load.

2. The on-vehicle electronic control device according to claim 1, wherein the predetermined time period is a response time or less of a system having the control load closed by the control load closing means.

3. The on-vehicle electronic control device according to claim 1, wherein the control load closing means closes a plurality of control loads not interfering with each other.

4. The on-vehicle electronic control device according to claim 3, wherein the controlling means stops controlling while the control loads closed by the control load closing means are being closed when the abnormality detecting means detects the abnormality of the terminals of the relay.

5. The on-vehicle electronic control device according to claim 1, wherein the controlling means starts controlling by closing the relay after breaking the control load when the abnormality detecting means does not detect the abnormality of the terminals of the relay.

6. An on-vehicle electronic control device comprising:
   a control load for controlling a running of an automobile or an internal combustion engine;
   a relay having terminals for selectively providing power from a power source to the control load;
   a voltage detecting means for detecting a voltage of the terminals of the relay;
   a power source detecting means for detecting that the power source has been broken;
   a controlling means for controlling the control load and the relay;
   said controlling means comprising:
   a relay opening means for opening the terminals of the relay when the power source detecting means detects a breakage of the power source;

a control load closing means for closing the control load when said relay opening means opens the terminals of the relay; and an abnormality detecting means for detecting an abnormality of the terminals of the relay by comparing the voltage with a predetermined value a predetermined time after the relay opening means has opened the terminals of the relay.

7. A method of detecting a failure of an on-vehicle electronic control device comprising:

a step of closing a control load when a signal for closing terminals of a relay selectively supplying power from a power source to the control load is not outputted;

a step of determining that a predetermined time period has elapsed after closing the control load;

a step of detecting a voltage of the terminals of the relay after the predetermined time period has elapsed; and a step of detecting a failure of the terminals of the relay by comparing said voltage with a predetermined value.

8. A method of detecting a failure of an on-vehicle electronic control device comprising:

a step of detecting a voltage outputted to terminals of a relay selectively supplying power from a power source to a control load;

a step of determining that the power source has been broken;

a step of opening the terminals of the relay when a breakage of the power source has been determined;

a step of closing the control load for a predetermined time after the terminals of the relay are opened; and a step of determining an abnormality of the terminals of the relay by comparing said voltage with a predetermined value after the terminals of the relay have been opened.

* * * * *